(12) United States Patent
Zhang et al.

(10) Patent No.: US 12,327,763 B2
(45) Date of Patent: Jun. 10, 2025

(54) TREATMENT METHODS FOR TITANIUM NITRIDE FILMS

(71) Applicant: Applied Materials, Inc., Santa Clara, CA (US)

(72) Inventors: Xinming Zhang, Santa Clara, CA (US); Shashank Sharma, Fremont, CA (US); Abhilash J. Mayur, Salinas, CA (US); Norman L. Tam, Cupertino, CA (US); Matthew Spuller, Belmont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 817 days.

(21) Appl. No.: 17/398,899

(22) Filed: Aug. 10, 2021

(65) Prior Publication Data
US 2022/0108914 A1    Apr. 7, 2022

Related U.S. Application Data

(60) Provisional application No. 63/086,269, filed on Oct. 1, 2020.

(51) Int. Cl.
*H01L 21/768*    (2006.01)
*H01L 23/532*    (2006.01)
*H10B 12/00*    (2023.01)

(52) U.S. Cl.
CPC .. *H01L 21/76883* (2013.01); *H01L 21/76886* (2013.01); *H01L 23/53261* (2013.01); *H10B 12/488* (2023.02)

(58) Field of Classification Search
CPC ......... H01L 21/76883; H01L 21/76862; H01L 21/76864
See application file for complete search history.

(56) References Cited

U.S. PATENT DOCUMENTS 5,360,996 A    11/1994 Nulman et al.
5,552,341 A *  9/1996 Lee ................... H01L 21/76882
                                                    438/653

(Continued)

FOREIGN PATENT DOCUMENTS

JP    H09172083 A    6/1997
JP    2001291682 A   10/2001

(Continued)

OTHER PUBLICATIONS

Rino Micheloni et al. "Architectural and Integration Options for 3D NAND Flash Memories," Computers. 2017; 6(3):27.

(Continued)

*Primary Examiner* — Daniel Luke
(74) *Attorney, Agent, or Firm* — Patterson + Sheridan, LLP

(57) ABSTRACT

Embodiments herein are directed to methods of forming titanium nitride films suitable for use as a bulk fill material for conductive features in a semiconductor device, such as for capacitor electrodes and/or buried word lines in a dynamic random-access memory (DRAM) device. In one embodiment, a method of forming conductive features in a semiconductor device is provided. The method includes thermally treating a substrate surface comprising at least portions of a titanium nitride layer in the presence of hydrogen radicals. Thermally treating the substrate includes positioning the substrate in a processing volume of a processing chamber, heating the substrate to a treatment temperature of more than about 250° C., generating the hydrogen radicals using a remote plasma source fluidly coupled to the processing volume, and maintaining the substrate at the treatment temperature while concurrently exposing the at least portions of the titanium nitride layer to the generated hydrogen radicals. Here, the substrate includes a field surface having a plurality of openings formed therein and the at (Continued)

least portions of the titanium nitride layer are disposed in the plurality of openings.

19 Claims, 9 Drawing Sheets

(56) References Cited

U.S. PATENT DOCUMENTS

| | | | | |
|---|---|---|---|---|
| 5,843,843 | A | * | 12/1998 | Lee .................. H01L 21/76856 |
| | | | | 257/E21.585 |
| 5,970,378 | A | * | 10/1999 | Shue ................. H01L 21/76862 |
| | | | | 438/909 |
| 5,989,999 | A | * | 11/1999 | Levine ................ C23C 16/5096 |
| | | | | 438/653 |
| 6,001,736 | A | * | 12/1999 | Kondo ............. H01L 21/76877 |
| | | | | 257/E21.585 |
| 6,060,389 | A | * | 5/2000 | Brennan ........... H01L 21/76843 |
| | | | | 257/E21.59 |
| 6,291,343 | B1 | * | 9/2001 | Tseng ................ H01L 21/76862 |
| | | | | 438/653 |
| 6,555,183 | B2 | | 4/2003 | Wang et al. |
| 6,703,306 | B2 | | 3/2004 | Lee |
| 8,021,514 | B2 | | 9/2011 | Fu et al. |
| 8,309,448 | B2 | | 11/2012 | Hwang et al. |
| 8,637,912 | B1 | | 1/2014 | Park |
| 8,698,233 | B2 | | 4/2014 | Yune et al. |
| 9,157,730 | B2 | | 10/2015 | Rajagopalan et al. |
| 9,768,060 | B2 | * | 9/2017 | Shaviv ..................... C25D 5/34 |
| 9,953,984 | B2 | | 4/2018 | Danek et al. |
| 10,211,211 | B1 | | 2/2019 | Chang et al. |
| 10,497,704 | B2 | | 12/2019 | Lin et al. |
| 10,847,519 | B2 | * | 11/2020 | Ji ...................... H01L 21/02126 |
| 2002/0106881 | A1 | * | 8/2002 | Jain .................. H01L 21/76844 |
| | | | | 438/600 |
| 2002/0155219 | A1 | | 10/2002 | Wang et al. |
| 2004/0086434 | A1 | | 5/2004 | Gadgil et al. |
| 2011/0003447 | A1 | | 1/2011 | Kim et al. |
| 2011/0008950 | A1 | | 1/2011 | Xu |
| 2011/0300720 | A1 | | 12/2011 | Fu et al. |
| 2012/0309181 | A1 | | 12/2012 | Machkaoutsan et al. |
| 2019/0103280 | A1 | | 4/2019 | Yang et al. |
| 2019/0233940 | A1 | | 8/2019 | Guo et al. |
| 2019/0296026 | A1 | | 9/2019 | Ji et al. |
| 2021/0280428 | A1 | | 9/2021 | Zhang et al. |

FOREIGN PATENT DOCUMENTS

| | | | |
|---|---|---|---|
| JP | 2002500276 | A | 1/2002 |
| JP | 2004296490 | A | 10/2004 |
| JP | 2014135311 | A | 7/2014 |
| JP | 2015183224 | A | 10/2015 |
| KR | 20010033812 | A | 4/2001 |
| KR | 20010078215 | A | 8/2001 |
| KR | 20110003219 | A | 1/2011 |
| KR | 20200039017 | A | 4/2020 |

OTHER PUBLICATIONS

D. James, "Recent advances in memory technology," ASMC 2013 SEMI Advanced Semiconductor Manufacturing Conference, 2013, pp. 386-395, doi: 10.1109/ASMC.2013.6552766.

Delphine Longrie et al. "Thermal and Plasma-Enhanced Atomic Layer Deposition of TiN Using TDMAT and NH3 on Particles Agitated in a Rotary Reactor", ACS Appl. Mater. Interfaces 2014, 6, 10, 7316-7324 Publication Date:May 6, 2014 https://doi.org/10.1021/am5007222.

International Search Report dated Nov. 26, 2021 for Application No. PCT/US2021/045406.

Office Action issued to Japanese Application No. 2023-511598 on Oct. 22, 2024 in 11 pages.

Japanese Office Action dated Jun. 4, 2024 for Application No. 2023-511598.

Korean Office Action dated Jun. 18, 2024 for Application No. 10-2023-7009215.

Taiwan Office Action dated Dec. 31, 2024 for Application No. 110130091.

Korean Office Action dated Mar. 26, 2025 for Application No. 10-2023-7009215.

* cited by examiner

TREATMENT METHODS FOR TITANIUM NITRIDE FILMS

CROSS-REFERENCE TO RELATED APPLICATIONS

This Application claims the benefit of U.S. Provisional Application 63/068,269 filed on Aug. 20, 2020, which is herein incorporated by reference in its entirety.

BACKGROUND

Field

Embodiments described herein generally relate to electronic device manufacturing, and more particularly, to methods of forming titanium nitride fill materials for use as conductive features in a semiconductor device, such as for use as a buried word line in a dynamic random access memory device.

Description of the Related Art

Tungsten (W) is commonly used as a fill material to form many of the conductive features of a semiconductor device. For example, tungsten is often used to form low resistivity electrical connections within dielectric material layers, i.e., horizontally disposed metal interconnects, vertical through vias between adjacent dielectric layers to connect the horizontally disposed metal interconnects, and contacts between the metal layers and the devices formed on or in the substrate disposed there beneath. Due to its low resistivity, tungsten is also commonly used to form the bit lines and word lines used to address individual memory cells in a memory cell array of a dynamic random-access memory (DRAM) device.

Typically, tungsten conductive features are formed by etching an opening, e.g., a hole or a trench, in a material layer, lining the opening with a conductive barrier material, and depositing a layer of tungsten to fill the lined openings and form the conductive features. Titanium nitride (TiN) is commonly used as the conductive barrier material or "barrier metal" to line the openings due to its ability to block diffusion of the tungsten fill material into the surrounding material layer and to promote adhesion between the tungsten fill material and walls of the lined openings.

Unfortunately, as circuit densities increase and device features continue to shrink to meet the demands of the next generation of semiconductor devices, reliably producing tungsten features has become increasingly problematic. Issues such as poor step coverage of the titanium nitride layers within the openings and voids in the deposited tungsten fill material become amplified with decreasing feature size and can detrimentally affect the performance of a device or the reliability of a device and/or render a device inoperable.

Accordingly, there is a need in the art for improved bulk-fill materials to form conductive features in semiconductor devices and methods of forming the same.

SUMMARY

Embodiments herein are directed to methods of forming titanium nitride films suitable for use as a bulk fill material for conductive features in a semiconductor device, such as for capacitor electrodes and/or buried word lines in a dynamic random-access memory (DRAM) device.

In one embodiment, a method of forming conductive features in an electronic device is provided. The method includes thermally treating a substrate surface comprising at least portions of a titanium nitride layer in the presence of hydrogen radicals. Thermally treating the substrate includes positioning the substrate in a processing volume of a processing chamber, heating the substrate to a treatment temperature of more than about 250° C., generating the hydrogen radicals using a remote plasma source fluidly coupled to the processing volume, and maintaining the substrate at the treatment temperature while concurrently exposing the at least portions of the titanium nitride layer to the generated hydrogen radicals. Here, the substrate includes a field surface having a plurality of openings formed therein, and the at least portions of the titanium nitride layer are disposed in the plurality of openings.

In another embodiment, a method of forming a memory device includes thermally treating a titanium nitride layer in the presence of hydrogen radicals. Thermally treating the titanium nitride layer includes positioning a substrate in a processing volume of a first processing chamber, heating the substrate to a treatment temperature of more than about 250° C., generating the hydrogen radicals using a remote plasma source fluidly coupled to the processing volume, and maintaining the substrate at the treatment temperature while concurrently exposing the titanium nitride layer to the generated hydrogen radicals. The substrate features a field surface having a plurality of openings formed therein, and at least portions of a titanium nitride layer are disposed in the plurality of openings. Here, the at least portions of the titanium nitride layer disposed in the plurality of openings form buried word lines of a memory device.

In another embodiment, a method of forming buried word lines in a memory device is provided. The method includes (a) positioning a substrate in a first processing volume of a first processing chamber, where the substrate may include a field surface having a plurality of openings formed therein; (b) depositing a titanium nitride layer on the field surface of the substrate to at least partially fill the plurality of openings, (c) positioning the substrate in a second processing volume of a second processing chamber that is connected to the first processing chamber, (d) heating the substrate to a treatment temperature of more than about 250° C., and (e) exposing the titanium nitride layer to hydrogen radicals generated using a remote plasma source fluidly coupled to the second processing volume.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein are directed to methods of forming titanium nitride films suitable for use as a bulk fill material for conductive features in a semiconductor device, such as for capacitor electrodes and/or buried word lines in a dynamic random-access memory (DRAM) device. Titanium nitride is a ceramic material that is conductive enough to provide low ohmic contacts between metal features and/or metal-semiconductor junctions while serving as a barrier material to prevent reaction and interdiffusion between the respective materials thereof. Thus, when used as a relatively thin barrier or liner for a conductive metal, titanium nitride is considered as a "barrier metal."

Typically, although relatively thin layers of titanium nitride exhibit metallic-type electrical behavior, the resistivity of conventionally formed titanium nitride layers is too high for the material to be useful as a bulk-fill conductive material in most semiconductor device applications. Thus, embodiments herein provide for hydrogen radical assisted thermal treatment of titanium nitride films to desirably reduce the electrical resistivity thereof. Beneficially, in addition to reducing the electrical resistivity of deposited titanium nitride layers, the methods herein remove undesirable impurities therefrom resulting in increased device performance and improved device reliability and yield.

Figure 1A:
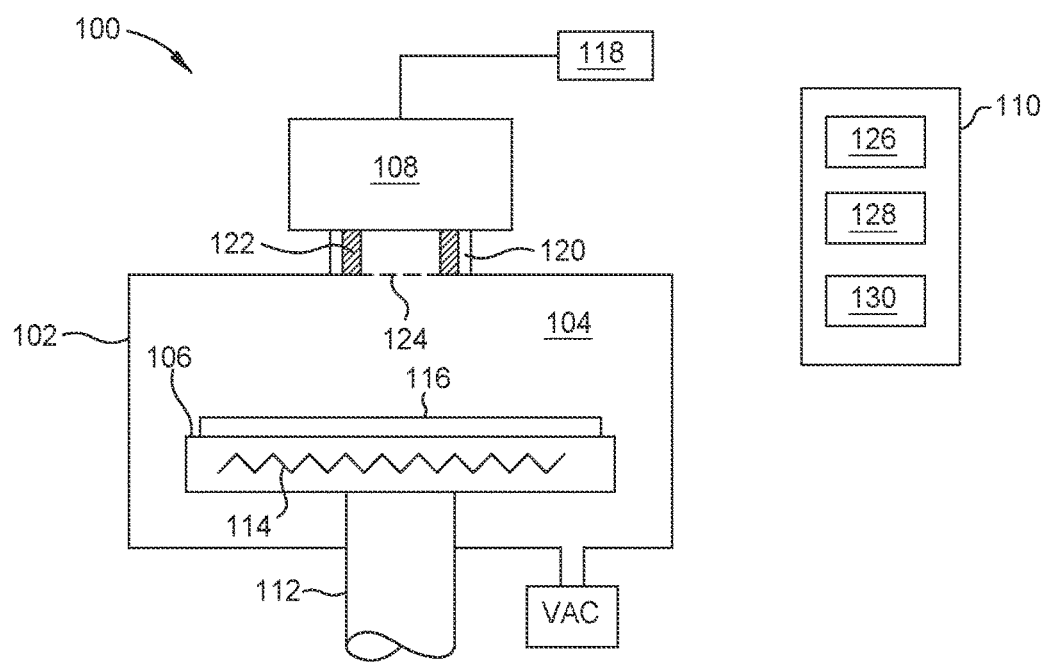
FIGS. 1A and 1B are schematic sectional views of exemplary processing chambers which may be used to perform the methods set forth herein.

FIG. 1A schematically illustrates an exemplary thermal processing system, processing chamber 100, which may be used to perform aspects of the methods described herein. Here, the processing chamber 100 features a chamber body 102 that defines a processing volume 104, a substrate support assembly 106 disposed in the processing volume 104, a remote plasma source (RPS) 108 fluidly coupled to the processing volume 104, and a system controller 110. The processing volume 104 is fluidly coupled to a vacuum source, such as to one or more dedicated vacuum pumps, which maintains the processing volume 104 at sub-atmospheric conditions and evacuates processing and other gases therefrom. The substrate support assembly 106 includes a substrate support 107 disposed on a support shaft 112 that sealingly extends through a base of the chamber body 102, such as being surrounded by a bellows (not shown) in a region above or below the chamber base. Herein, the substrate support 107 includes a heater 114, e.g., a resistive heating element, that is used to heat the substrate support 107, and thus a substrate 116 disposed on the substrate support 107, to a desired processing temperature.

The RPS 108 is fluidly coupled to a hydrogen gas source 118 and is used to generate hydrogen radicals which are then flowed into the processing volume 104 through a conduit 120 fluidly coupled therebetween. In some embodiments, the conduit 120 features a dielectric liner 122, e.g., a quartz liner or an alumina liner, disposed therein. The dielectric liner 122 beneficially reduces the recombination of the radical species that might otherwise occur between the RPS 108 and the processing volume 104.

Generally, plasma excitation of the hydrogen gas to form neutral hydrogen radicals also forms charged hydrogen ions that may be accelerated towards the substrate 116 and cause undesirable damage to the features formed in the surface thereof. Thus, in some embodiments, the processing chamber 100 further includes an ion filter 124 disposed between the RPS 108 and the substrate support 107. The ion filter 124 is used to remove hydrogen ions from the effluent of the RPS 108. Examples of suitable ion filters that may be used with the processing chamber 100 include electrostatic filters, wire or mesh filters, plates with relatively aspect ratio openings (e.g., >2:1), and magnetic ion filters. In embodiments herein, the ion filter 124 removes substantially all of the generated ion radicals from the RPS effluent before the effluent reaches the processing volume 104. As used herein, "substantially all of the generated hydrogen ions" means about 95% of the hydrogen ions generated by the RPS 108 or more.

The operation of the processing chamber 100 is facilitated by the system controller 110. The system controller 110 includes a programmable central processing unit, here the CPU 126, which is operable with a memory 128 (e.g., non-volatile memory) and support circuits 130. The CPU 126 is one of any form of general-purpose computer processor used in an industrial setting, such as a programmable logic controller (PLC), for controlling various chamber components and sub-processors. The memory 128, coupled to the CPU 126, is non-transitory and is in the form of a computer-readable storage media containing instructions (e.g., non-volatile memory), that when executed by the CPU 126, facilitates the operation of the processing chamber. The support circuits 130 are conventionally coupled to the CPU 126 and comprise cache, clock circuits, input/output subsystems, power supplies, and the like, and combinations thereof coupled to the various components of the processing chamber 100, to facilitate control of substrate processing operations therewith.

Here, the instructions in the memory 128 are in the form of a program product such as a program that implements the methods of the present disclosure. In one example, the disclosure may be implemented as a program product stored on computer-readable storage media for use with a computer system. The program(s) of the program product defines functions of the embodiments (including the methods described herein). Thus, the computer-readable storage media, when carrying computer-readable instructions that direct the functions of the methods described herein, are embodiments of the present disclosure. In some embodiments, the processing chamber 100 may include any one or combination of the features of the processing system 150 described in FIG. 1B.

Figure 1B:
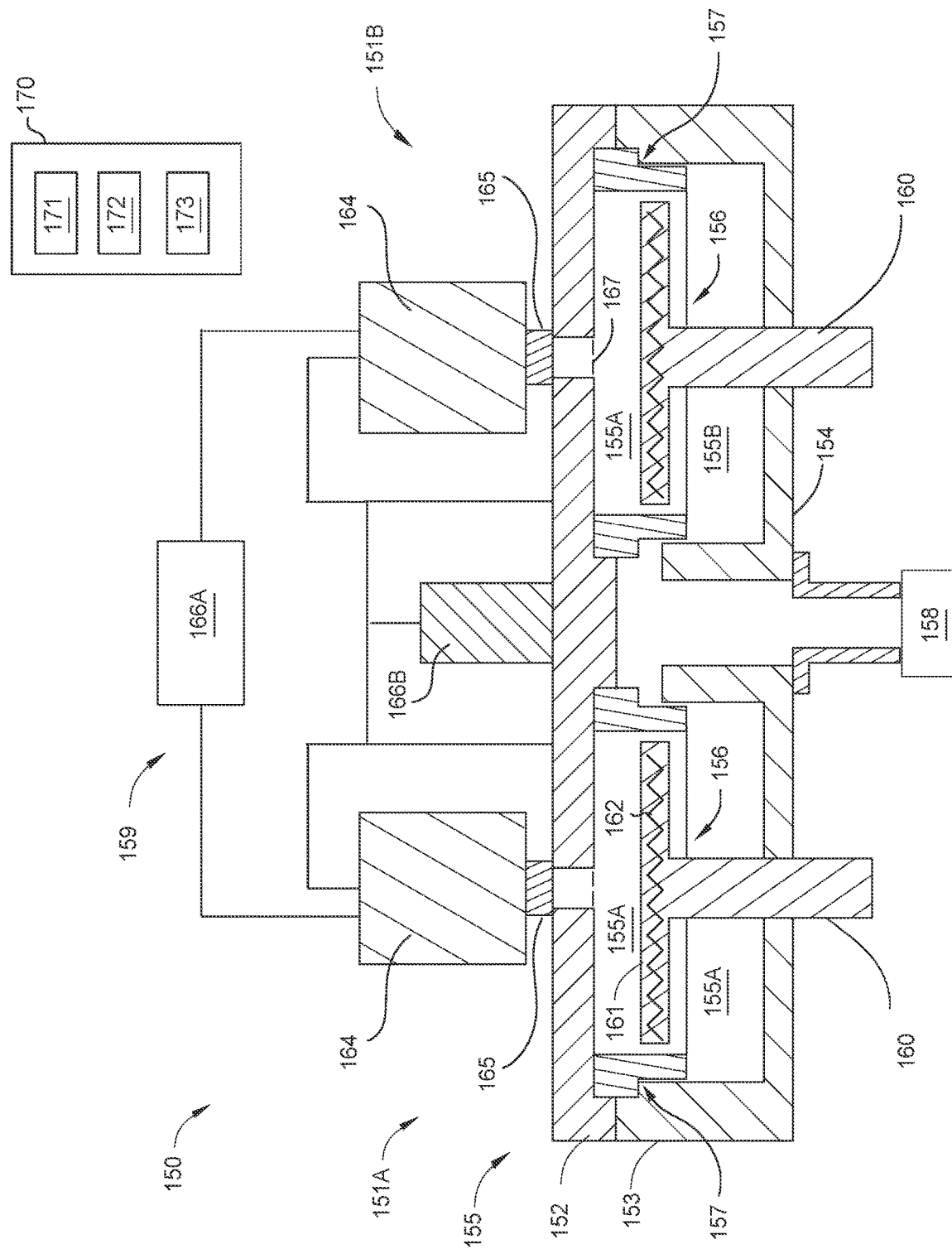

FIG. 1B is a schematic cross-sectional view illustrating a processing system 150, according to one embodiment, which may be used to perform the methods set forth herein. Here, the processing system 150 features tandem processing chambers 151A-B having a chamber lid 152, one or more chamber walls 153, and a chamber base 154 that collectively define a first chamber volume 155A and a second chamber volume 155B. Here, the configuration of each of the processing chambers 151A-B are substantially similar to one another to facilitate concurrent processing of a plurality of substrates (not shown) under the same or substantially similar process conditions. One or both of the processing chambers 151A-B may include any one or combination of the features of the processing chamber 100 described in FIG. 1A. In other embodiments, the configuration of the processing chambers 151A-B, e.g., one or more features and components thereof, are different from one another.

Each of the chamber volumes 155A-B has a respective substrate support assembly 156 disposed therein and a process kit 157 comprising one or more shields or liners used to shield processing components from the chamber volumes 155A-B and to direct the flow of gases therein. The chamber volumes 155A-B are fluidly coupled to a common vacuum source 158, such as one or more dedicated vacuum pumps, which are used to maintain the chamber volumes 155A-B at sub-atmospheric conditions and to evacuate processing and other gases therefrom. Processing gases are respectively delivered to the chamber volumes 155A-B using a common gas delivery system 159.

Here, each substrate support assembly 156 includes a support shaft 160 movably disposed through the chamber base 154, and a substrate support 161 disposed on the support shaft 160. Generally, the substrate support 161 includes a heater 162, such as a resistive heating element, used to heat and maintain a substrate at a desired processing temperature. The chamber lid 152, the substrate supports 161, and shields and liners of the corresponding process kits 157 collectively define respective processing volumes 163A-B when the substrate supports 161 are in a raised position.

As shown, each of the processing volumes 163A-B is fluidly coupled to a respective remote plasma source (RPS) 164 using a gas conduit 165 disposed therebetween. Each RPS 164 is fluidly coupled to one or more gas sources 166A-B of the gas delivery system 159, which deliver processing and other gases thereto. In some embodiments, each of the gas conduits 165 includes a dielectric liner (not shown), such as the dielectric liner 122 described in FIG. 1A, and the processing system 150 further includes one or more ion filters 167 disposed between each RPS 164 and the substrate support 161 disposed in the processing volumes 163A-B. The ion filter 167 may be the same or substantially similar to the ion filter 124 described in FIG. 1A. In other embodiments, a single remote plasma source may be used to deliver activated species to each of the processing volumes 163A-B.

Operation of the processing system is facilitated by a system controller 170, which includes a CPU 171, memory 172, and support circuits 173, which are configured as described for the system controller 110 of FIG. 1A and include instructions in the memory 172 for implementing the methods described herein.

Figure 2:
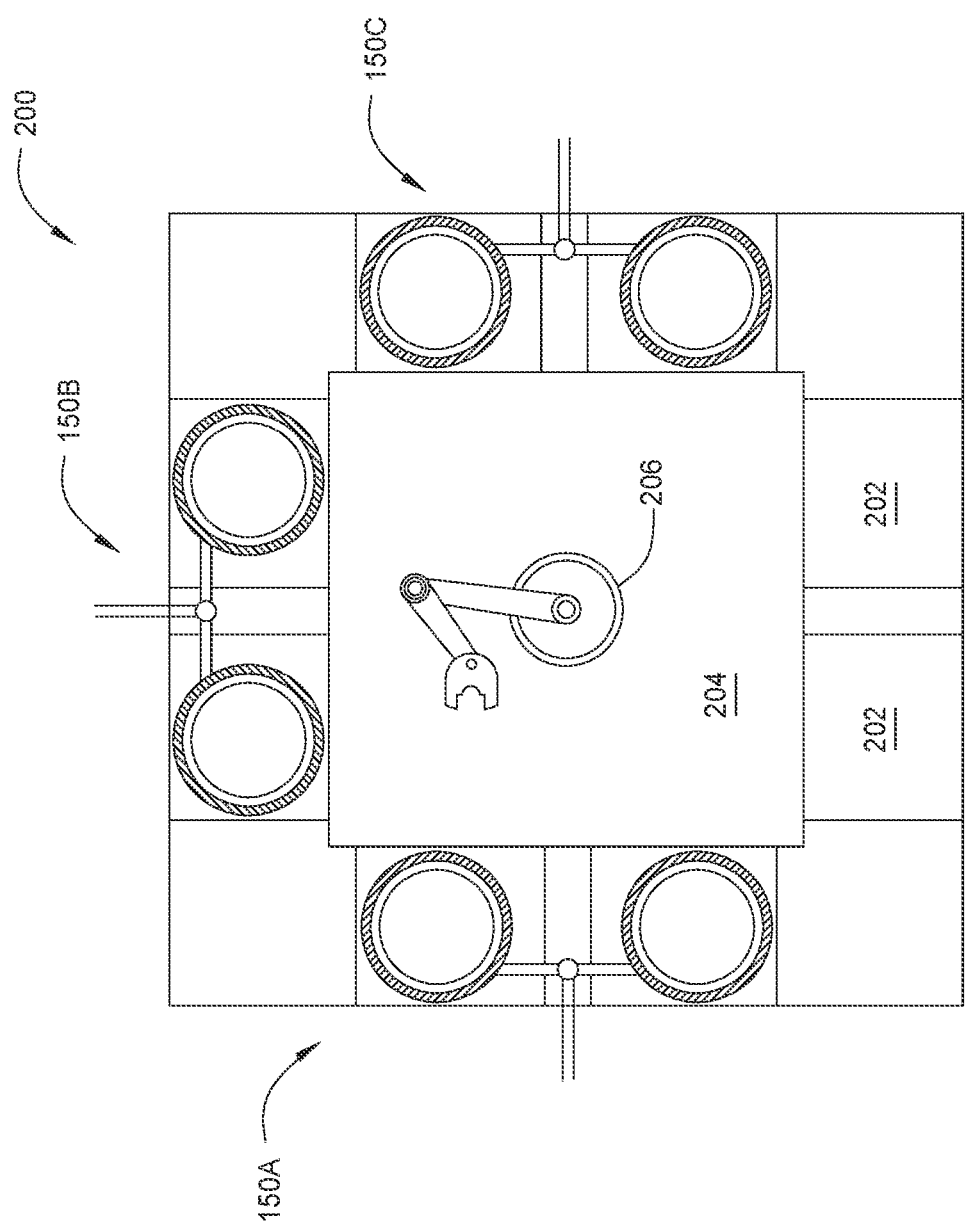
FIG. 2 is a schematic plan view of a multi-chamber processing system that may be used to perform the methods set forth herein.

FIG. 2 is a top-down sectional view schematically illustrating a multi-chamber processing system 200, according to one embodiment, which may be used to perform the methods set forth herein. Here, the multi-chamber processing system 200 includes one or more load lock chambers 202 for receiving substrates into the multi-chamber processing system 200, a transfer chamber 204, and a plurality of processing systems 150A-C, here a first processing system 150A, a second processing system 150B, and an optional third processing system 150C. Each of the processing systems 150A-C are fluidly coupled to one another by the transfer chamber 204 disposed therebetween. The first processing system 150A is configured to perform the hydrogen radical treatment methods described herein and may be the same or substantially similar to the processing system 150 described in FIG. 1B. The second processing system 150B comprises one or more deposition chambers suitable for depositing titanium nitride, e.g., any one of a chemical vapor deposition (CVD) chamber, an atomic layer deposition (ALD) chamber, or a physical vapor deposition (PVD) chamber. The optional third processing system 150C is an etch system configured to remove an overburden of titanium nitride from the field surface of a substrate or a deposition system configured to deposit dielectric materials, e.g., silicon oxides or silicon nitrides. The transfer chamber 204 includes a substrate handler 206 to facilitate transfer substrates between the processing systems 150A-C. Here, the transfer chamber 204 is maintained under vacuum so that the substrate may be transferred between the processing systems 150A-C to perform various aspects of the methods set forth herein without exposing the substrate to atmospheric conditions.

Figure 3:
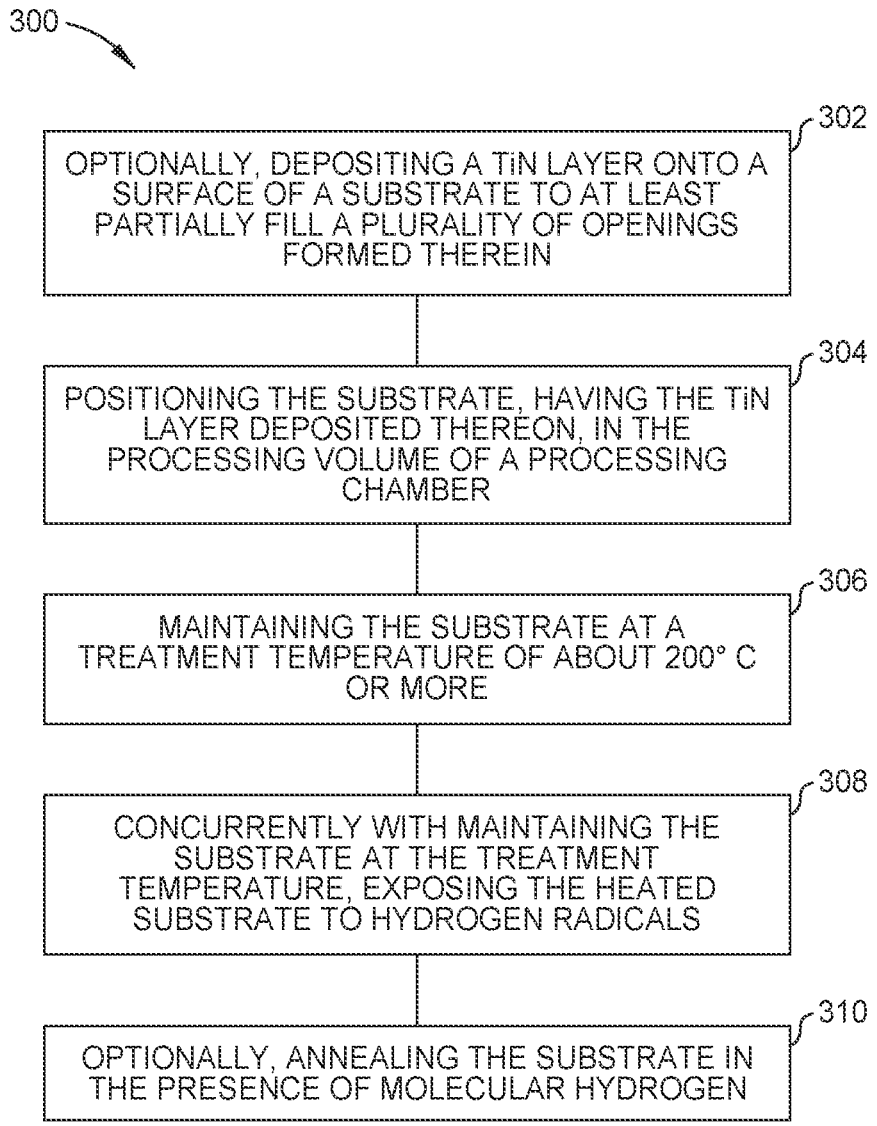
FIG. 3 is a diagram illustrating a method of forming a conductive feature of an electronic device, according to one embodiment.
Figure 4A:
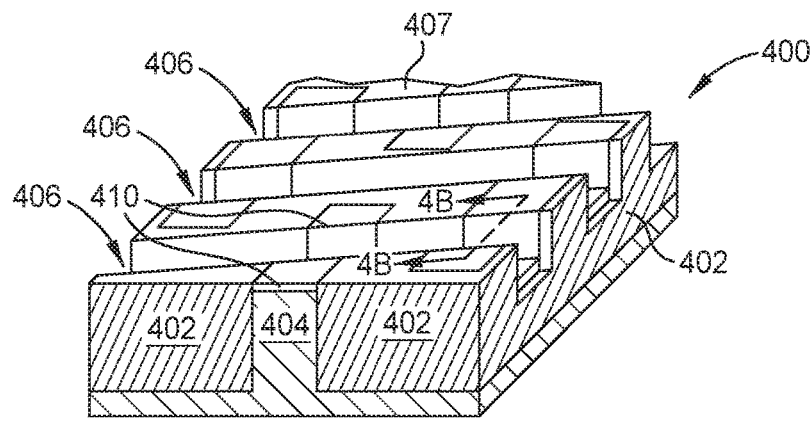
FIGS. 4A-4F are schematic sectional views of a semiconductor substrate that illustrate aspects of the method of FIG. 3.
Figure 4B:
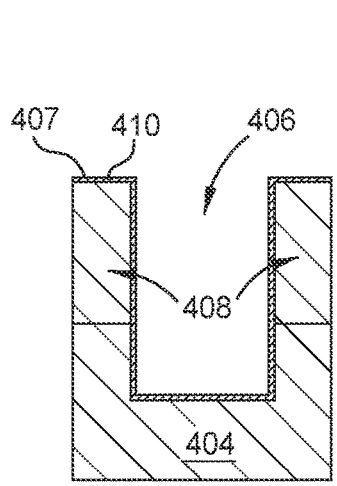

FIG. 3 is a diagram illustrating a method of forming a conductive feature of a semiconductor device, according to one embodiment. FIGS. 4A-4F illustrate various aspects of the method 300. FIG. 4A is a schematic isometric view of a portion of a substrate having a partially manufactured dynamic random-access memory (DRAM) device formed thereon. FIGS. 4B-4F schematically illustrate the formation of a buried word line (bWL) on the DRAM device. FIG. 4B is a sectional view of FIG. 4A taken along line 4B-4B. It is contemplated that the method 300, or various aspects thereof, may be performed using the processing chamber 100 and/or the multi-chamber processing system 200 described above, although other suitable chambers may be used.

Generally, the substrate 400 is formed of semiconducting material, such as silicon, polysilicon, or silicon-germanium, and includes a plurality of shallow trench isolation (STI) regions 402 formed therein to define a plurality of spaced apart and electrically isolated active areas 404. The STI regions 402 are formed of a dielectric material, such as silicon oxide, and are used to electrically isolate the active areas 404 from one another and thus prevent current leakage therebetween.

In the partially manufactured DRAM device, a plurality of openings, here word line trenches 406, are formed in a field surface 407 of the substrate 400. Each of the plurality of word line trenches 406 extend through portions of the STI regions 402 and through portions of the active areas 404 to separate source/drain doped regions 408 disposed on opposite sides thereof (FIG. 4B). Here, the source/drain doped regions 408 are formed by implanting an N-type or P-type dopant into portions of the active areas 404 of the substrate 400. Typically, the exposed portions of the active areas 404 are oxidized after the buried word line trenches 406 are formed therein to provide a thin layer of dielectric material, e.g., silicon oxide 410 thereon.

At activity 302, the method 300 optionally includes depositing a titanium nitride (TiN) layer 412 onto the field surface 407 to fill, or at least partially fill, the plurality openings, e.g., the plurality of word line trenches 406. The TiN layer 412 (FIG. 4C) may be deposited using any suitable process such as chemical vapor deposition (CVD), atomic layer deposition (ALD), or physical vapor deposition (PVD). For example, in one embodiment, a CVD process includes reacting a titanium precursor, such as $TiCl_4$, and a nitrogen precursor, such as $N_2$ or $NH_3$, at the surface of the substrate. In another embodiment, an ALD process includes alternating repeatedly exposing the surface of the substrate to a titanium precursor, such as $TiCl_4$ or a titanium-organic precursor comprising carbon, and a nitrogen precursor, such as $N_2$ or $NH_3$.

Generally, one or both of the CVD or ALD process may be plasma-enhanced, where the method includes forming a plasma of one or both of the precursors to form radical species thereof and exposing the substrate to the plasma and/or the radical species formed therefrom. The plasma may be in-situ (formed in the processing volume) or may be formed remotely from the substrate, e.g., by use of a remote plasma source. In other embodiments, one or both of the CVD or ALD processes are thermal processes, e.g., where the substrate is heated to promote reactions at the surface thereof.

In some embodiments, the TiN layer 412 is deposited using a plasma-enhanced PVD process where plasma excited species of a sputtering gas are used to bombard a titanium target and sputter titanium atoms therefrom. The titanium atoms are then deposited on the substrate surface in the presence of a nitrogen precursor, such as $N_2$, to form the TiN layer 412. Here, the TiN layer 412 is deposited on the field surface 407 to a sufficient thickness to fill the openings, e.g., the word line trenches formed therein. In some embodiments, the TiN layer 412 is deposited onto a substrate disposed in a processing chamber of a multi-chamber processing system before the substrate is transferred to a different processing chamber to perform a hydrogen radical thermal treatment. In some embodiments, both the deposition of the TiN layer 412 and the hydrogen radical thermal treatment thereof are performed in the same processing chamber.

At activity 304, the method 300 includes positioning the substrate 400, having the TiN layer 412 deposited thereon (FIG. 4C), in the processing volume of a processing chamber. Here, the processing volume is maintained under vacuum conditions, such as less than atmospheric pressure, such as less than about 500 Torr, less than about 400 Torr, less than about 300 Torr, less than about 200 Torr, less than about 100 Torr, or less than about 50 Torr. In some embodiments, the processing volume is maintained at a pressure between about 10 mTorr and about 50 Torr, such as between about 1 mTorr and about 10 mTorr.

At activity 306, the method 300 includes heating the substrate 400 to and maintaining the substrate 400 at a treatment temperature of about 200° C. or more, such as 250° C. or more, about 300° C. or more, about 350° C. or more, about 400° C. or more, or about 425° C. or more. In some embodiments, the thermal treatment temperature is in a range from about 200° C. to about 600° C., such as from about 250° C. to about 600° C., from about 250° C. to about 500° C., from about 250° C. to about 500° C., e.g., about 300° C., or from about 350° C. to about 550° C., such as from about 400° C. to about 500° C., e.g., about 450° C. In some embodiments, the treatment temperature is less than about 1000° C., such as less than about 900° C., less than about 800° C., less than about 700° C., or less than about 600° C.

At activity 308, the method 300 includes exposing the heated substrate 400 to hydrogen radicals 413. Here, the hydrogen radicals 413 are formed by flowing hydrogen gas ($H_2$) into a remote plasma source (RPS) fluidly coupled to the processing volume and igniting and maintaining a plasma of the hydrogen gas to form radical species 413 thereof. The hydrogen radicals 413 are then flowed into the processing volume, and the surface of the TiN layer 412 of the heated substrate 400 is exposed thereto. Typically, the flow rate of hydrogen gas ($H_2$) to the RPS for processing of a 300 mm diameter substrate is between about 10 sccm and about 5000 sccm, such as between about 100 sccm and about 1500 sccm. Appropriate scaling may be used for different-sized substrates. In other embodiments, a remote plasma may be formed in a portion of a processing volume of a processing chamber that is separated from the portion of the processing volume having the substrate disposed therein. For example, in those embodiments, the remote plasma may be formed in a portion of a processing volume that is separated from the substrate processing portion by a showerhead.

Typically, the effluent from the RPS is flowed through an ion filter to remove substantially all ions therefrom before the hydrogen radicals reach the processing volume and the surface of the substrate disposed therein. In embodiments where the remote plasma is formed in a separate portion of the processing volume, a showerhead disposed between the remote plasma and the substrate processing portion may be used as the ion filter.

Here, activities 306 and 308 are performed concurrently so that the substrate is maintained at the desired treatment temperature, and the TiN layer 412 disposed thereon is concurrently exposed to the hydrogen radicals 413 for a desired treatment time. As discussed below, the sheet resistance of a TiN layer 412 formed according to the method 300 desirably decreases with increased treatment temperature and increased treatment time. In some embodiments, the treatment time, here the amount of time the substrate 400 is maintained at the treatment temperature while the TiN layer 412 is concurrently exposed to hydrogen radicals from the RPS, is about 20 seconds or more, such as about 30 seconds or more, about 40 seconds or more, about 50 seconds or more, about 1 minute or more, about 1.5 minutes or more, about 2 minutes or more, about 2.5 minutes or more, about 3 minutes of more, about 3.5 minutes or more, about 4 minutes or more, about 4.5 minutes or more, e.g., about 5 minutes or more.

At activity 310, the method 300 optionally includes a thermal bake process comprising maintaining the substrate at or near the treatment temperature in the presence of hydrogen gas. Here, the thermal bake process includes maintaining the substrate 400 at the treatment temperature or heating the substrate 400 to a second temperature that is different than the treatment temperature while concurrently flowing hydrogen gas into the processing volume. Typically, flowing hydrogen gas into the processing volume includes extinguishing the plasma formed in the RPS while continuing to flow hydrogen gas there into. At activity 310, the hydrogen gas may be flowed at about the same flow rate as during the hydrogen radical treatment activities 306 and 308 or may be increased or decreased relative thereto. Activity 310 of the method 300 may be performed in the same processing chamber as activities 306 and 308. In other embodiments, the substrate 400 may be transferred under vacuum to a second processing chamber of a multi-chamber processing system, and the thermal bake process may be performed in the second processing chamber. In some embodiments, the second temperature at activity 310 is about 1.10× or greater than the treatment temperature at 306 and 308, such as about 1.2× or greater, about 1.3× or greater, about 1.4× or greater, about 1.5× or greater, about 1.6× or greater, about 1.7× or greater, about 1.8× or greater, about 1.9× or greater, or about 2× or greater. In other embodiments, the second temperature is about 1.1× or less than the treatment temperature at 306 and 308, such as about 1.2× or less, about 1.3× or less, about 1.4× or less, about 1.5× or less, about 1.6× or less, about 1.7× or less, about 1.8× or less, about 1.9× or less, or about 2× or less.

Figure 4C:
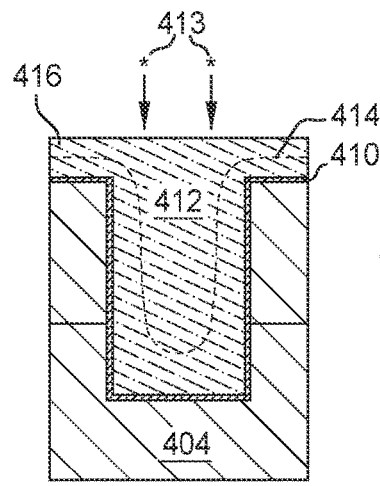

Here, activities 306, 308, and, optionally, 310 are performed after the TiN layer 412 has been deposited to a thickness sufficient to fill the openings, e.g., the word line trenches 406, formed in the field surface 407, such as shown in FIG. 4C. In other embodiments, the openings may be filled by alternating repetitions of depositing relatively thin titanium nitride layers 414 (shown in phantom) in the first processing chamber and thermally treating the relatively thin titanium nitride layers 414 in the presence of hydrogen radicals until the accumulated thin titanium nitride layers fill the plurality of openings to at least the level of the field surface.

Figure 4D:
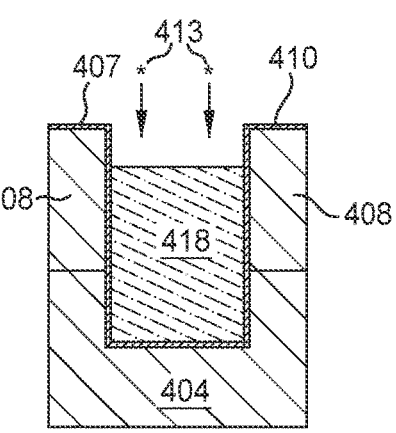
Figure 4E:
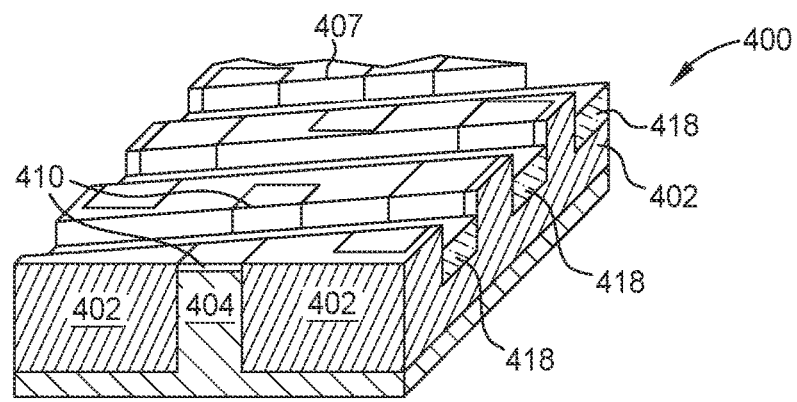
Figure 4F:
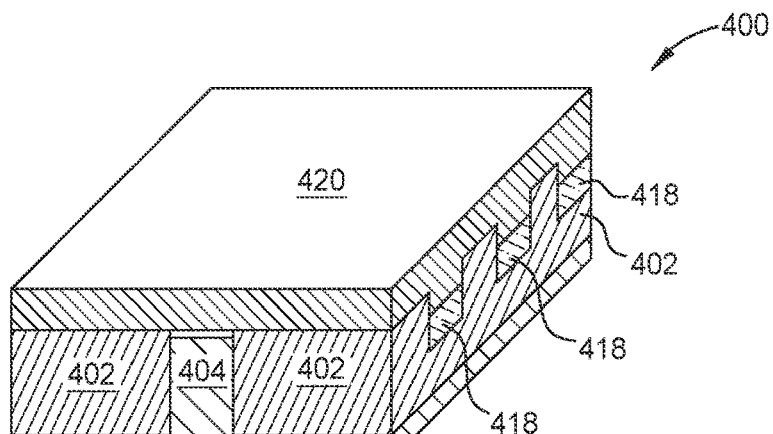

Typically, once the openings are filled, TiN overburden 416 is removed from the field surface 407, e.g., by a chemical mechanical polishing (CMP) process or an etch-back process, such as shown in FIG. 4D. In some embodiments, such as a DRAM manufacturing process, the TiN overburden 416 is removed from the field surface 407 using an etch-back process to form a plurality of buried word lines 418 comprising and/or consisting essentially of titanium nitride, such as shown in FIG. 4E. Typically, in those embodiments, the buried word lines 418 are recessed from the field surface 407 to ensure electrical isolation from one another and/or from other conductive features proximate thereto. Thereafter, a dielectric layer 420 (FIG. 4F) is deposited over the field surface 407 to electrically isolate the buried word lines 418 and provide further protection thereto, e.g., from exposure to atmospheric conditions. In some embodiments, the hydrogen radical thermal treatment method and the etch-back process are each performed in different processing chambers of a multi-chamber processing system, e.g., the multi-chamber processing system 200 of FIG. 2. In some embodiments, the hydrogen radical thermal treatment is performed on the TiN layer 412/buried word lines 418 after the overburden 416 has been removed from the field surface, i.e., after CMP or etch-back process.

Beneficially, the hydrogen radical thermal treatment methods provided above promote titanium nitride grain growth, yield a desired crystallographic orientation at the titanium nitride surface, and remove undesirable impurities therefrom, to improve (reduce) the resistivity of the conductive features.

It is believed that the hydrogen radicals of the thermal treatment promote grain growth (increase in the size of crystallites in a material) in an as-deposited titanium nitride film layer by diffusing into the titanium nitride film to lower the activation energy barrier required for grain boundary mobility. The resulting larger grain (crystallite) sizes result in a reduced percentage of grain boundary areas (volume fraction) in the titanium nitride layer. It can be appreciated that a reduced percentage of grain boundary areas results in reduced electron scattering at the surfaces of the grain boundaries and a corresponding reduction in the effective resistance of conductive features formed therefrom.

In addition to promoting grain growth, it has been found that the methods set forth herein desirably facilitate grain ration during the grain growth stage, although the resulting texture depends, at least in part, on the type of substrate used and the method of depositing the TiN layer thereon. In some embodiments, the treated TiN layer comprises a textured surface with (111) and (222) crystal orientations that serve to further (desirably) lowers the resistivity of the resulting film.

In addition to promoting grain growth and desirable crystal orientations in the titanium nitride material, the methods set forth herein desirably result in titanium nitride layers with fewer impurities when compared to the as-deposited film. Typically, the CVD, ALD, and PVD methods described above introduce undesired process-caused impurities, such as chlorine or carbon, into the titanium nitride film. The hydrogen radicals of the treatment method react with the impurities to form volatile species, such as HCl and/or CHx, which are then outgassed from the titanium nitride film and evacuated from the processing volume. Beneficially, the hydrogen atoms introduced during the treatment process that do not form volatile HCl and/or CHx species are expelled from the TiN as the grain sizes increase because there are fewer grain boundary sites for the hydrogen atoms to occupy. As shown below, higher treatment temperatures result in a lower hydrogen concentration in the TiN layer post-treatment.

Figure 5A:
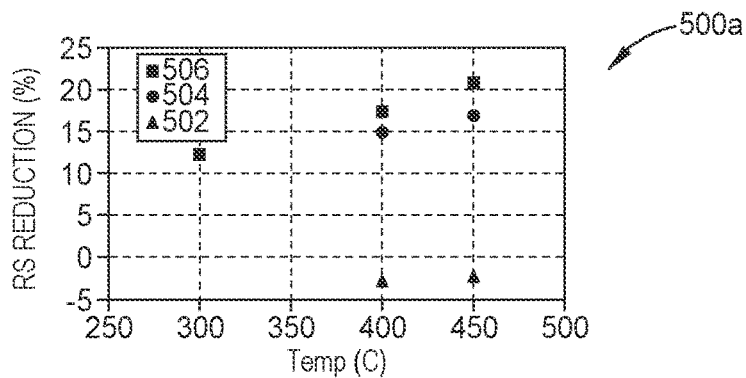
FIGS. 5A-5C, 6A-6D, 7A-7D, and 8 graphically illustrate various material properties of titanium nitride (TiN) layers formed using the methods set forth herein.
Figure 5B:
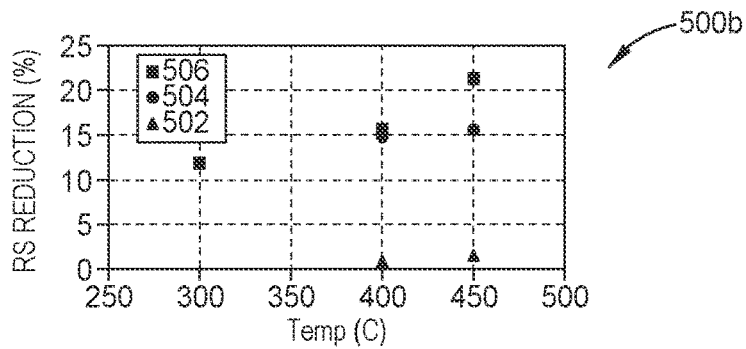
Figure 5C:
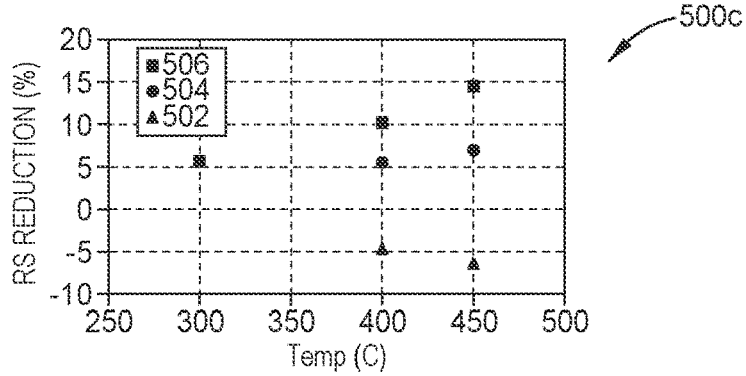

FIGS. 5A-5C are graphs showing the percentage change of titanium nitride film resistivity (Rs) following the treatment methods set forth herein. In FIG. 5A, the titanium nitride layers 500a were deposited using an ALD method of alternating exposure of the substrate to TiCl4 and $NH_3$. In FIG. 5B, the titanium nitride layers 500b were deposited using an ALD method of alternating exposure of the substrate to a titanium-organic compound and a nitrogen precursor. In FIG. 5C, the titanium nitride layers 500c were deposited using a PVD method of sputtering titanium from a titanium target onto a substrate disposed in a nitrogen-rich environment. Each of the titanium nitride layers 500a-c was deposited to a thickness of about 15 nm.

Each of the titanium nitride layers 500a-c was heated to and maintained at temperatures between 300° C. to 450° C. with concurrent exposure to either molecular hydrogen ($H_2$ gas) for 5 minutes (treatment conditions 502), hydrogen radicals for 1 minute (treatment conditions 504), or hydrogen radicals for 5 minutes (treatment conditions 506). For each of the treatment conditions 502, 504, and 506, the processing volume was maintained at a pressure of less than 5 Torr. Here, resistivity reduction is characterized by a percentage change in the sheet resistance (Rs) between measurements taken before and after thermal treatment.

As shown in FIGS. 5A-5C, for thermal treatment with only molecular hydrogen ($H_2$ gas) for a duration of 5 minutes (treatment condition 502), no obvious resistivity (Rs) reduction is observed for each of the respective ALD, CVD and PVD deposited films 502a-c. Instead, an increased resistivity is observed, which is likely contributable due to the formation of $TiO_xN_y$ by atmosphere exposure after the substrates were removed from the processing system. For the hydrogen radical treatments 504, 506, the amount of Rs reduction increased with both treatment temperature and treatment time. Among different types of films, the greatest resistivity reduction was observed for the metal-organic compound ALD deposited TiN layer (500b) under treatment conditions 506 where the substrate was maintained at about 450° C. for 5 minutes while concurrently exposed to hydrogen radicals. Under the same treatment conditions, the $TiCl_4$ ALD deposited and the PVD deposited TiN layers, 500a and 500c, yielded a resistivity reduction of 20.8% and 14.6%, respectively. Here, the majority of Rs reduction occurs during the early stage of the hydrogen radical process. For example, for the $TiCl_4$ deposited TiN layers 500a, maintaining the substrate at about 450° C. for 1-minute with concurrent exposure to hydrogen radicals (treatment conditions 504) yielded resistivity reduction of 17.0%, while a time of 5 minutes (treatment conditions 506) resulted in 20.8% Rs reduction, i.e., a non-linear resistivity improvement over time.

Figure 6A:
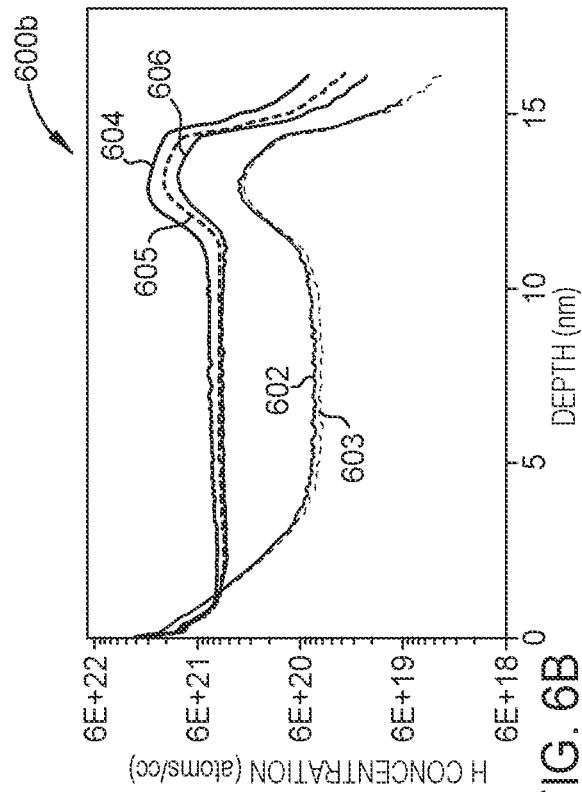
Figure 6B:
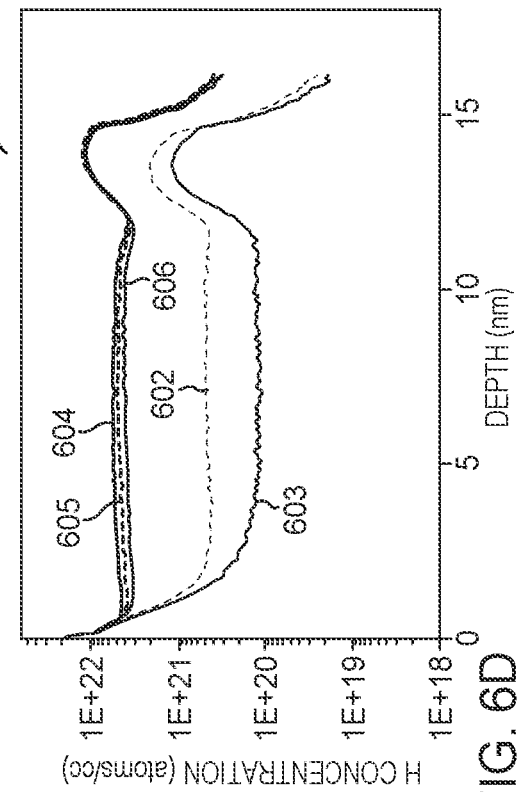
Figure 6C:
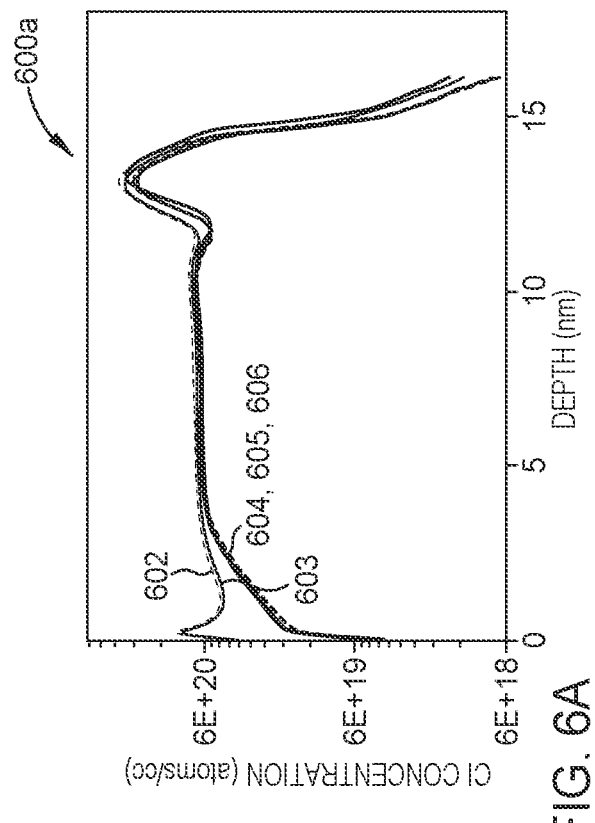
Figure 6D:
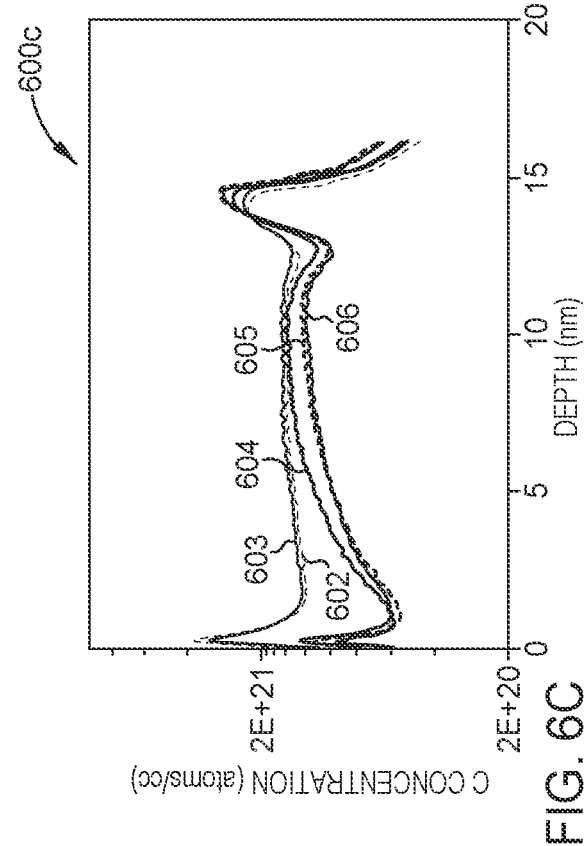
Figure 7A:
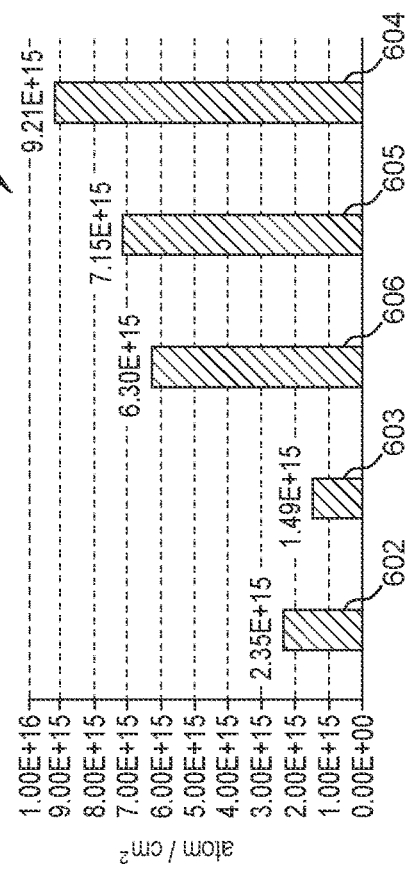
Figure 7B:
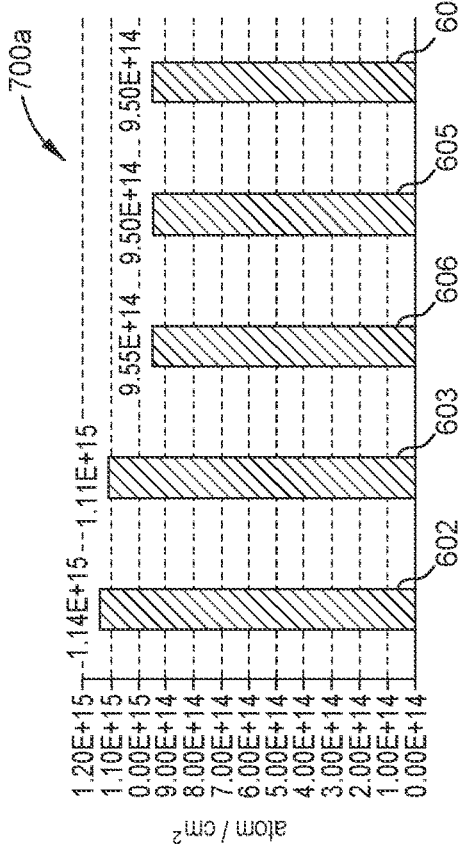
Figure 7C:
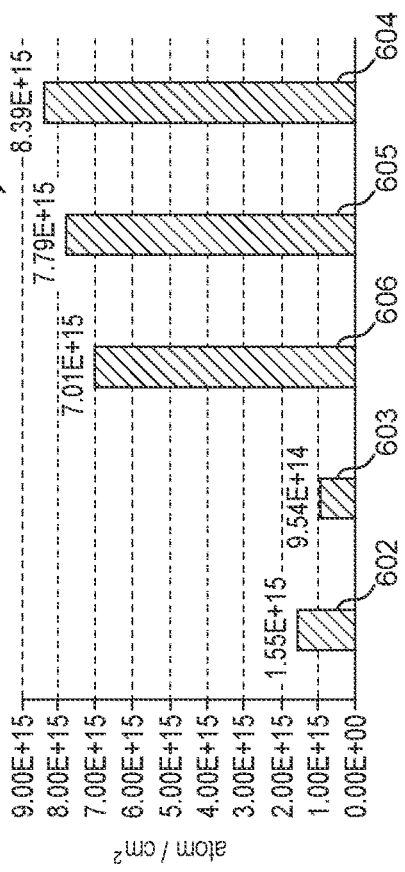
Figure 7D:
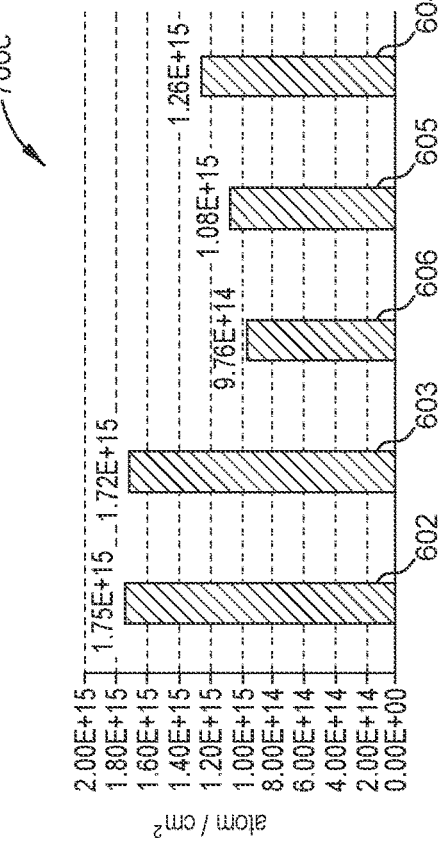

FIGS. 6A-6B illustrate chlorine concentration profiles 600a and hydrogen concentration profiles 600b of $TiCl_4$ ALD deposited TiN layer treated according to the methods set forth herein. Here, the TiCl4 ALD deposited TiN layers were deposited using the same processing conditions as the TiCl4 ALD TiN layers of FIG. 5A. FIGS. 6C-6D illustrate carbon concentration profiles 600c and hydrogen concentration profiles 600d of metal-organic compound ALD deposited TiN layers. The metal-organic compound layers were deposited to the same thickness and at the same conditions as those set forth for FIG. 5B.

Here, FIGS. 6A-6D show impurity profiles with as-deposited films 602, which were not treated using the methods set forth herein, treatment method 603, which included maintaining the substrate at a temperature of 450° C. for 5 minutes while concurrently exposing the surface to molecular hydrogen, and treatment methods 604-606 which included maintaining the substrates at respective temperatures of 300° C., 400° C., and 450° C. for 5 minutes each while concurrently exposing the surfaces thereof to hydrogen radicals.

For chlorine impurity (FIG. 6A), the hydrogen radical treatment methods 604-606 show significant chlorine removal in the top 5 nm of the TiN layer, when compared to the as-deposited TiN layer 602. The depth of impurity removal often depends on the quality and condition of the as-deposited film. For example, in FIG. 6A, the hydrogen treatment methods 604-606 show significate chlorine removal from the top 5 nm of the TiN layer when compared to the as-deposited TiN layer 602. For other TiCl deposited films, significant chlorine removal was observed through substantially all of the treated TiN film, i.e., chlorine impurities were reduced through the bulk of the treated TiN film. No significant chlorine removal is observed for the molecular hydrogen treatment method 603. In FIG. 6C, no significant carbon impurity removal is observed between the as deposited TiN layer 602 and the molecular hydrogen treatment method 603. In FIG. 6C, the hydrogen radical assisted thermal treatment methods 604-606 lead to carbon reduction both at the surface and inwardly therefrom with increasing carbon reduction observed at higher treatment temperatures. Both the TiCl4 ALD and metal-organic compound ALD TiN layers exhibited reduced hydrogen concentration after treatment method 603 when compared to the as-deposited TiN layer 602, with a more pronounced reduction for the metal-organic compound ALD TiN layer.

Here, the hydrogen radical treatments 604-606 incorporate hydrogen into both ALD deposited TiN layers (FIGS. 6B, 6D) with lower hydrogen concentrations observed under increasing treatment temperatures 604-606. In embodiments where hydrogen incorporation is not desired, the method 300 may further include a thermal bake process to remove undesired hydrogen from the TiN layers, such as described above in activity 310.

Quantitative analysis of area density based on secondary ion mass spectrometry (SIMS) results for chlorine concentrations 600a and hydrogen concentrations 600b of TiCl4 ALD deposited TiN layers and the carbon concentrations 600c and the hydrogen concentrations 600d for treatment methods 602-606 are respectively shown in FIGS. 7A-7D.

Figure 8:
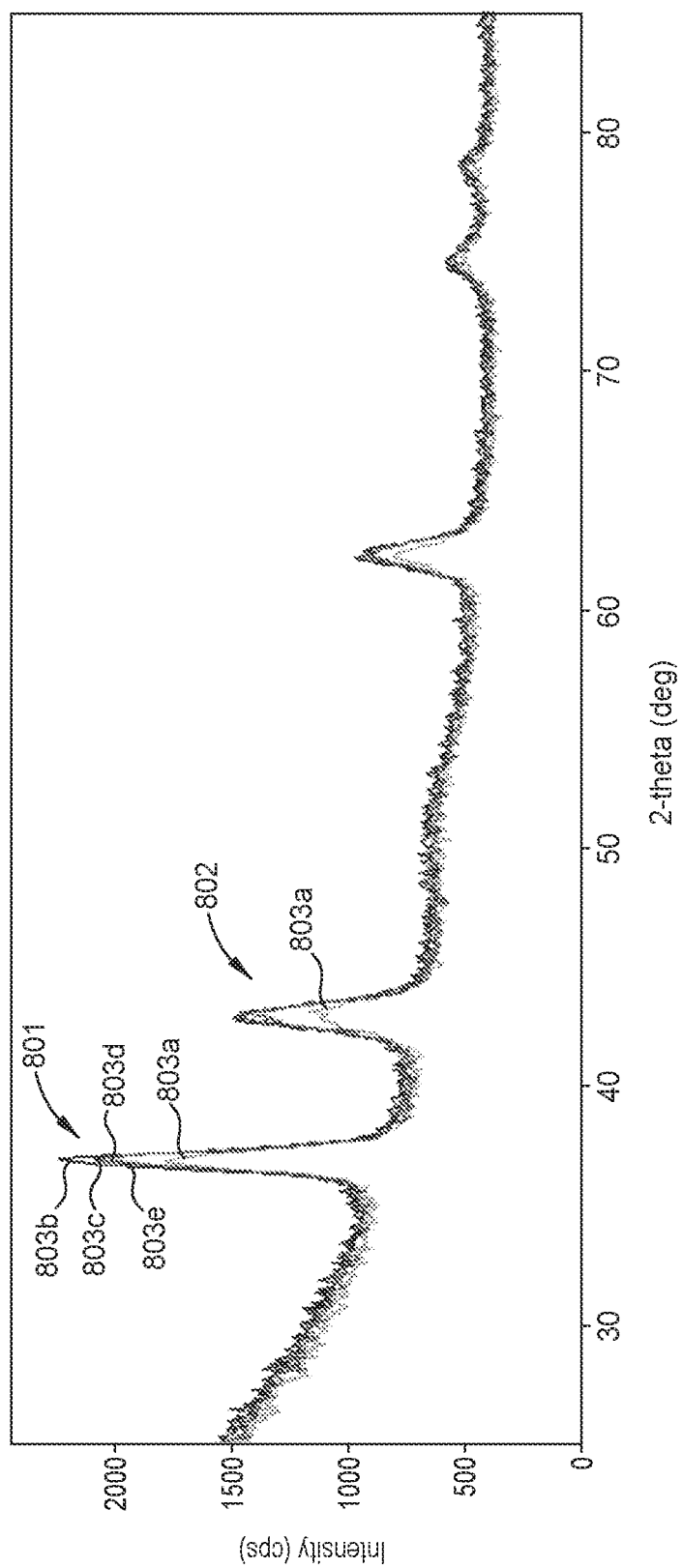

FIG. 8 illustrates an X-Ray diffraction analysis for TiN layers for substrates 803a-e exposed to various treatment methods. Peak 801 indicates a (111) crystal orientation. Peak 802 indicates a (200) crystal orientation. The TiN layer of substrate 803a did not receive treatment and had the lowest intensity at both peaks 801 and 802. The TiN layer of substrate 803b was heated to has the highest intensity at peaks 801 and 802 and was treated using a rapid thermal anneal process by heating the substrate to and maintaining the substrate at about 850° C. in the presence of molecular nitrogen ($N_2$) for a duration one minute. The TiN layer of substrate 803c has the second-highest intensity at peaks 801 and 802 and was treated by heating the substrate 803 to and maintaining the substrate at about 550° C. in the presence of hydrogen radicals for a duration of one minute. The TiN layer of substrate 803d has the third-highest intensity peak and was treated by heating the substrate 803 to and maintaining the substrate at about 550° C. in the presence of hydrogen radicals for a duration of four minutes. The TiN layer of substrate 803e has the fourth-highest intensity peak and was treated by heating the substrate 803e to and maintaining the substrate at about 550° C. in the presence of molecular hydrogen ($H_2$) for a duration of 1 minute.

While the foregoing is directed to embodiments of the present disclosure, other and further embodiments of the disclosure may be devised without departing from the basic scope thereof, and the scope thereof is determined by the claims that follow.

The invention claimed is:

1. A method of forming conductive features in an electronic device, comprising:
    thermally treating a substrate surface comprising at least portions of a titanium nitride layer, comprising:
        positioning a substrate in a processing volume of a first processing chamber, the substrate comprising a field surface having a plurality of openings formed therein and the at least portions of the titanium nitride layer disposed in the plurality of openings;
        heating the substrate to a first temperature of more than about 250° C.;
        generating hydrogen radicals using a remote plasma source fluidly coupled to the processing volume;
        maintaining the substrate at the first temperature while concurrently exposing the at least portions of the titanium nitride layer to the generated hydrogen radicals; and
        extinguishing plasma formed in the remote plasma source
        while concurrently flowing hydrogen gas into the processing volume.

2. The method of claim 1, wherein generating the hydrogen radicals comprises:
    flowing hydrogen gas (H2) into the remote plasma source;
    igniting and maintaining a plasma of the hydrogen gas; and
    flowing an effluent of the remote plasma source into the processing volume, wherein the effluent comprises the hydrogen radicals.

3. The method of claim 2, further comprising removing, by use of an ion filter, hydrogen ions from the effluent of the remote plasma source before flowing the effluent into the processing volume.

4. The method of claim 1, wherein the titanium nitride layer is also disposed on the field surface, and the titanium nitride layer fills the plurality of openings to at least a level of the field surface.

5. The method of claim 1, wherein the titanium nitride layer forms a plurality of buried word lines of a memory device.

6. The method of claim 1, further comprising depositing the titanium nitride layer in a second processing chamber before transferring the substrate to the first processing chamber, wherein the first processing chamber is connected to the second processing chamber by a transfer chamber disposed therebetween.

7. The method of claim 6, further comprising alternating repetitions of depositing titanium nitride layers in the second processing chamber and exposing the titanium nitride layers to hydrogen radicals in the first processing chamber until a plurality of titanium nitride layers fill the plurality of openings to at least a level of the field surface.

8. A method of forming a memory device, comprising:
thermally treating a titanium nitride layer, comprising:
- positioning a substrate in a processing volume of a first processing chamber, the substrate comprising a field surface having a plurality of openings formed therein and at least portions of the titanium nitride layer disposed in the plurality of openings, wherein the at least portions of the titanium nitride layer form a plurality of buried word lines;
- heating the substrate to a treatment temperature of more than about 250° C.;
- generating hydrogen radicals using a remote plasma source fluidly coupled to the processing volume;
- maintaining the substrate at the treatment temperature while concurrently exposing the titanium nitride layer to the generated hydrogen radicals; and
- extinguishing plasma formed in the remote plasma source
- while concurrently flowing hydrogen gas into the processing volume.

9. The method of claim 8, wherein the memory device comprises source and drain regions disposed on opposite sides of the buried word lines.

10. The method of claim 8, wherein generating the hydrogen radicals comprises:
- flowing hydrogen gas (H2) into the remote plasma source;
- igniting and maintaining a plasma of the hydrogen gas; and
- flowing an effluent of the remote plasma source into the processing volume, wherein the effluent comprises the hydrogen radicals.

11. The method of claim 10, further comprising removing, by use of an ion filter, generated hydrogen ions from the effluent of the remote plasma source before flowing the effluent into the processing volume.

12. The method of claim 8, wherein the titanium nitride layer is also disposed on the field surface, and wherein the titanium nitride layer fills the plurality of openings to at least a level of the field surface.

13. The method of claim 8, further comprising depositing the titanium nitride layer in a second processing chamber before transferring the substrate to the first processing chamber, wherein the first processing chamber is connected to the second processing chamber by a transfer chamber disposed therebetween.

14. The method of claim 13, further comprising alternating repetitions of depositing the titanium nitride layer in the second processing chamber and maintaining the substrate at the treatment temperature while concurrently exposing the titanium nitride layer to the generated hydrogen radicals in the first processing chamber until a plurality of the titanium nitride layers fill the plurality of openings to at least a level of the field surface.

15. A method of forming buried word lines in a memory device, comprising:
(a) positioning a substrate in a first processing volume of a first processing chamber, the substrate comprising a field surface having a plurality of openings formed therein;
(b) depositing a titanium nitride layer on the field surface of the substrate to at least partially fill the plurality of openings;
(c) positioning the substrate in a second processing volume of a second processing chamber that is connected to the first processing chamber;
(d) heating the substrate to a treatment temperature of more than about 250° C.;
(e) exposing the titanium nitride layer to hydrogen radicals generated using a remote plasma source fluidly coupled to the second processing volume; and
(f) extinguishing plasma formed in the remote plasma source
while concurrently flowing hydrogen gas into the second processing volume.

16. The method of claim 15, further comprising sequentially repeating (a)-(e) until the titanium nitride layers fill the plurality of openings to at least a level of the field surface.

17. The method of claim 15, wherein the hydrogen radicals are generated by:
- flowing hydrogen gas (H2) into the remote plasma source;
- igniting and maintaining a plasma of the hydrogen gas; and
- flowing an effluent of the remote plasma source into the second processing volume, wherein the effluent comprises the hydrogen radicals.

18. The method of claim 17, further comprising removing, by use of an ion filter, hydrogen ions from the effluent of the remote plasma source before flowing the effluent into the second processing volume.

19. The method of claim 15, wherein the memory device comprises source and drain regions disposed on opposite sides of the buried word lines.

* * * * *

UNITED STATES PATENT AND TRADEMARK OFFICE
CERTIFICATE OF CORRECTION

| | |
|---|---|
| PATENT NO. | : 12,327,763 B2 |
| APPLICATION NO. | : 17/398899 |
| DATED | : June 10, 2025 |
| INVENTOR(S) | : Xinming Zhang et al. |

Page 1 of 1

It is certified that error appears in the above-identified patent and that said Letters Patent is hereby corrected as shown below:

On the Title Page

Item (60), under "Related U.S. Application Data", delete "63/086,269", and insert -- 63/068,269 --.

Signed and Sealed this
Twenty-ninth Day of July, 2025

Coke Morgan Stewart
*Acting Director of the United States Patent and Trademark Office*